United States Patent
Min et al.

(10) Patent No.: US 8,507,030 B2
(45) Date of Patent: Aug. 13, 2013

(54) METHOD OF FABRICATING METAL OXIDE FILM ON CARBON NANOTUBE AND METHOD OF FABRICATING CARBON NANOTUBE TRANSISTOR USING THE SAME

(75) Inventors: Yo-seb Min, Seoul (KR); Eun-ju Bae, Seoul (KR); Un-jeong Kim, Busan (KR); Eun-hong Lee, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1164 days.

(21) Appl. No.: 12/081,454

(22) Filed: Apr. 16, 2008

(65) Prior Publication Data

US 2009/0186149 A1    Jul. 23, 2009

(30) Foreign Application Priority Data

Jan. 17, 2008  (KR) ......................... 10-2008-0005381

(51) Int. Cl.
*B05D 5/12*    (2006.01)
(52) U.S. Cl.
USPC .......................................... 427/78; 427/96.4
(58) Field of Classification Search
USPC ................................................ 427/78, 96.4
See application file for complete search history.

(56) References Cited

U.S. PATENT DOCUMENTS

| | | | | |
|---|---|---|---|---|
| 6,638,862 B2* | 10/2003 | Sneh | ............................. | 438/685 |
| 7,250,188 B2 | 7/2007 | Dodelet et al. | | |
| 2002/0001905 A1* | 1/2002 | Choi et al. | ..................... | 438/268 |
| 2002/0172768 A1* | 11/2002 | Endo et al. | ................ | 427/255.28 |
| 2004/0161899 A1* | 8/2004 | Luo et al. | ....................... | 438/287 |
| 2004/0197527 A1* | 10/2004 | Maula et al. | .................. | 428/172 |
| 2007/0049053 A1* | 3/2007 | Mahajani | ...................... | 438/785 |

FOREIGN PATENT DOCUMENTS

| JP | 2004-075422 A | 3/2004 |
|---|---|---|
| KR | 1020070012854 A | 1/2007 |

OTHER PUBLICATIONS

Atomic layer deposited Al2O3 for gate dielectric and passivation layer of single-walled carbon nanotube transistors; Purdue University, Apr. 17, 2007.*
Atomic Layer Deposition (ALD); Maryam Ebrahimi, University of Waterloo, Jan. 17, 2006.*
Vertical scaling of carbon nanotube field-effect transistors using top gate electrodes; S.J. Wind et al, Applied Physics letters, vol. 80, No. 20, May 20, 2002.*
Hlgh-k dielectrics for advanced carbon-nanotube transistors and logic gates; Ali Javey et al, Nov. 17, 2002.*
ALD of High-k dielectrics on suspended funtionalized SWNT; Damon B. Farmer et al, Feb. 10, 2005.*
Atomic Layer Deposition on suspended single-walled carbon nanotubes via Gas-phase noncovalent functionalization, Farmer et al, Feb. 6, 2006.*
Multilayer and functional coatings on carbon nanotubes using atomic layer deposition, Herrmann et al, Sep. 14, 2005.*

(Continued)

*Primary Examiner* — Joseph Del Sole
*Assistant Examiner* — Kimberly A Stewart
(74) *Attorney, Agent, or Firm* — Harness, Dickey & Pierce, P.L.C.

(57) ABSTRACT

Provided is a method of forming a metal oxide film on a CNT and a method of fabricating a carbon nanotube transistor using the same. The method includes forming chemical functional group on a surface of the CNT and forming the metal oxide film on the CNT on which the chemical functional group is formed.

12 Claims, 3 Drawing Sheets

(56) References Cited

OTHER PUBLICATIONS

Farmer, et al., "ALD of High-K Dielectrics on Suspended Functionalized SWNTs," *Electrochemical and Solid-State Letters*, vol. 8, No. 4, pp. G89-G91 (2005).

Farmer, et al., "Atomic Layer Deposition on Suspended Single-Walled Carbon Nanotubes via Gas-Phase Noncovalent Functionalization," *Nano Letters*, vol. 6, No. 4, pp. 699-703 (2006).

Min, et al., "ZnO nanoparticle growth on single-walled carbon nanotubes by atomic layer deposition and a consequent lifetime elongation of nanotube field emission," *Applied Physics Letters*, vol. 90, pp. 263104-1-263104-3 (2007).

* cited by examiner

METHOD OF FABRICATING METAL OXIDE FILM ON CARBON NANOTUBE AND METHOD OF FABRICATING CARBON NANOTUBE TRANSISTOR USING THE SAME

CROSS-REFERENCE TO RELATED PATENT APPLICATION

This application claims the benefit of Korean Patent Application No. 10-2008-00005381, filed on Jan. 17, 2008, in the Korean Intellectual Property Office, the disclosure of which is incorporated herein in its entirety by reference.

BACKGROUND OF THE INVENTION

1. Field of the Invention

The present invention relates to a method of forming a metal oxide film on carbon nanotubes and a method of fabricating a carbon nanotube transistor using the same, and more particularly, to a method of stably forming a metal oxide film on carbon nanotubes.

2. Description of the Related Art

Carbon nanotubes (CNTs) are one of carbon allotropes having a one dimensional structure. Since the CNTs show a ballistic transport phenomenon, CNTs are expected to be a next generation nano semiconductor material that may replace silicon semiconductor.

Recently, many studies have been conducted to manufacture a transistor using CNTs as a channel. In particular, an ultimate ideal carbon nanotube transistor to be fabricated using the one dimensional structure CNTs is a so-called gate-all around structure. That is, the CNTs that are used as a channel is hung between a source electrode and a drain electrode and a gate oxide film and gate electrode surround the CNTs.

Meanwhile, since only carbon atoms having sp2 bonding are present on an ideal surface of the CNTs, it is difficult to stably form a gate oxide film on the surface of the CNTs.

SUMMARY OF THE INVENTION

To address the above and/or other problems, the present invention provides a method of stably forming a necessary metal oxide film on a carbon nanotube (CNT).

The present invention also provides a method of fabricating a carbon nanotube transistor using the method of forming a metal oxide film on a CNT.

According to an aspect of the present invention, there is provided a method of forming a metal oxide film on a CNT, comprising: forming chemical functional group on a surface of the CNT; and forming the metal oxide film on the CNT on which the chemical functional group is formed.

The chemical functional group may comprise a hydroxyl group.

The forming of the chemical functional group may comprise simultaneously supplying a precursor of the metal oxide film and water into a reaction chamber.

The precursor and water may be supplied for 1 second to 60 second.

The CNT may be single walled CNT or a bundle of the CNT.

The forming of chemical functional group and the forming of the metal oxide film may be performed substantially at the same temperature.

The forming of the chemical functional group and the forming of the metal oxide film may be consecutively performed using an atomic layer deposition (ALD) method.

According to another aspect of the present invention, there is provided a method of fabricating a carbon nanotube transistor, comprising: forming a carbon nanotube channel on a substrate; forming chemical functional group on a surface of the CNT channel; forming a metal oxide film on the CNT channel on which the chemical functional group is formed; and forming a gate on the metal oxide film.

The method may further comprise forming a source and a drain on both ends of the carbon nanotube channel.

The metal oxide film may surround the CNT channel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
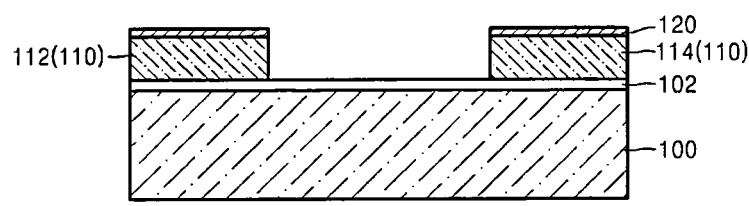
FIGS. 1A through 1E are cross-sectional views for explaining a method of fabricating a carbon nanotube field effect transistor according to an embodiment of the present invention.

The present invention will now be described more fully with reference to the accompanying drawings, in which exemplary embodiments of the invention are shown. Like reference numerals in the drawings denote like elements. In the drawings, the thicknesses of layers and regions are exaggerated for clarity. It will also be understood that when a layer is referred to as being "on" another layer or substrate, it can be directly on the other layer or substrate, or intervening layers may also be present.

A method of fabricating a carbon nanotube field effect transistor will now be described, and, at the same time, a method of forming a metal oxide on carbon nanotubes is described.

FIGS. 1A through 1E are cross-sectional views for explaining a method of fabricating a carbon nanotube field effect transistor according to an embodiment of the present invention.

Referring to FIG. 1A, an insulating layer 102 is formed on a substrate 100, and a metal layer 110 is deposited on the insulating layer 102. A catalyst layer 120 is deposited on the metal layer 110. A source 112 and a drain 114 are formed by sequentially patterning the catalyst layer 120 and the metal layer 110. The substrate 100 may be a Si substrate, and the insulating layer 102 may be formed of $SiO_2$. The metal layer 110 may be formed of Au or Al, and the catalyst layer 120 may be formed of Ni, Fe, Co, or an alloy of these metals.

Figure 1B:
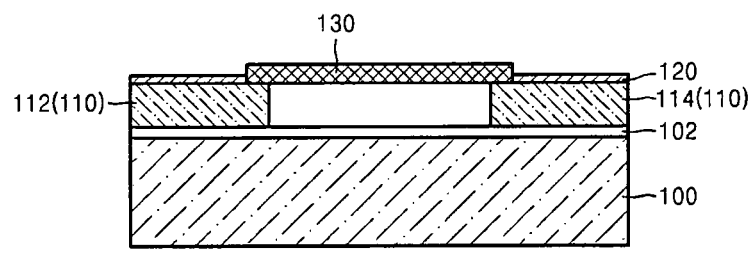

Referring to FIG. 1B, after placing the substrate 100 in a reaction chamber (not shown), methane gas is introduced into the reaction chamber while the reaction chamber is maintained at a temperature of 300 to 600° C. and at a pressure under 1 Torr. This chemical vapor deposition methods is a well known carbon nanotube growing process.

Thus, CNT 130 is grown on the catalyst layer 120 to connect the source 112 and the drain 114. The CNT may be a single walled CNT or a bundle of the single walled CNTs.

Figure 1C:
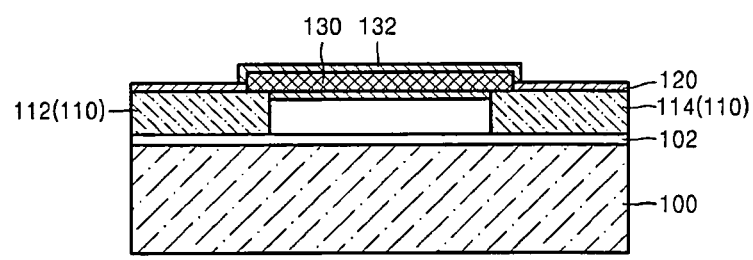

Referring to FIG. 1C, a material layer 132 that includes a chemical functional groups is formed on a surface of the CNT 130 by simultaneously supplying an oxidant and a precursor of a metal oxide to be formed on the CNT 130 into the reaction chamber where the CNT 130 is formed. The oxidant may be water. The precursor may be, for example, trimethylaluminum: $Al(CH_3)_3$, and in this case, the chemical functional group formed on the surface of the CNT 130 may be dihydroxylalumino group —$Al(OH)_2$ or hydroxylalumino group =Al—OH. That is, a metal hydroxyl group that includes hydroxyl group is formed on the surface of the CNT 130.

The purpose of forming the chemical functional group on the surface of the CNT 130 is to uniformly form a metal oxide thin film on the CNT 130. The supply of the precursor and the oxidant into the reaction chamber may be performed at a temperature of 100 to 400° C. for 1 second to 60 seconds. Chemical equation 1 explains the formation of the chemical functional group formed on the surface of the CNT 130.

  [Chemical equation 1]

where MLn represents metal precursor, M represents metal, L represents ligand, and n indicates the number of coordinated ligands.

Figure 1D:
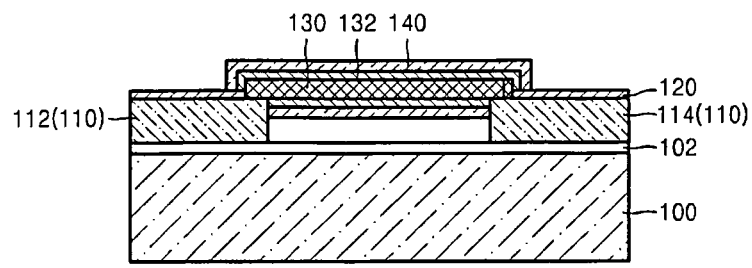

Referring to FIG. 1D, a metal oxide thin film 140 is formed on the CNT 130. The formation of the metal oxide thin film 140 is performed substantially at the same condition as the condition for forming the material layer 132 that includes chemical functional group consecutively to the formation of the chemical functional group using an ALD (atomic layer deposition) method. That is, the metal oxide thin film 140 is formed on the CNT 130 by repeatedly performing a precursor supplying process, a purging process, an oxidant supplying process, and a purging process. At this point, the ALD process is repeated until the metal oxide thin film 140 reaches a desired thickness. If the $Al(CH_3)_3$ is used as a precursor, the metal oxide thin film 140 may be an alumina thin film.

Chemical equations 2 and 3 show processes of forming the metal oxide thin film 140.

  [Chemical equation 2]

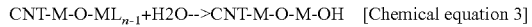  [Chemical equation 3]

Chemical equation 2 shows a surface reaction of the ALD method for forming an organic metal layer by supplying a precursor of a metal oxide $ML_n$ onto a CNT on which a chemical functional group is formed.

Chemical equation 3 shows a surface reaction of the ALD method for forming a metal oxide layer by removing a ligand from the organic metal layer by supplying steam into the reaction chamber. A purging operation is included between the Chemical equations 2 and 3 using an inert gas such as argon, and the ALD cycle of Chemical equation 2-purging-Chemical equation 3-purging is repeated until a desired thickness of the thin film is achieved.

Figure 1E:
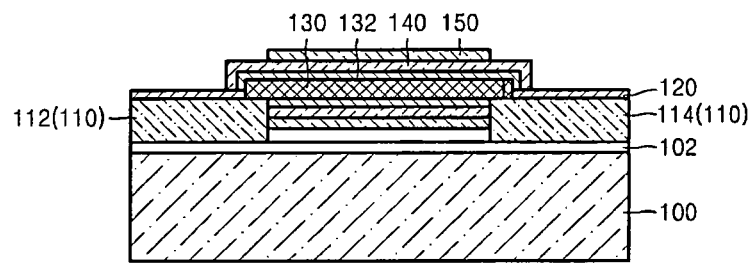

Referring to FIG. 1E, a gate metal layer (not shown) covering the metal oxide thin film 140 is formed on the substrate 100, and then, a gate 150 is formed on the metal oxide thin film 140 by patterning the gate metal layer. The gate metal layer may be formed of a conventional gate material such as polysilicon or aluminium.

The gate 150 is formed in a shape surrounding a surface of the metal oxide thin film 140. Thus, a field effect transistor formed in this manner may be a all-around field effect transistor.

The method of forming a metal oxide on the CNT may be applied in a state in which the CNT are vertically arranged, and thus, the method may be applied to manufacture various electronic devices that use CNTs.

Figure 2:
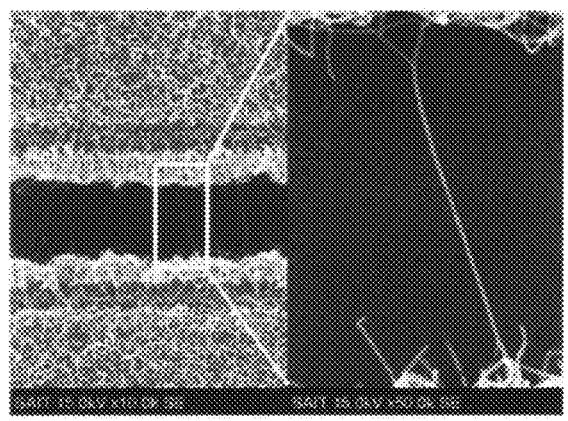
FIG. 2 is a scanning electron microscope (SEM) image of alumina formed on a surface of CNTs using an atomic layer deposition (ALD) method immediately after performing a pre-process disclosed in an embodiment of the present invention.

FIG. 2 is a scanning electron microscope (SEM) image of alumina formed on a surface of CNTs using an ALD method immediately after forming a material layer including a chemical functional group disclosed in an embodiment of the present invention. As shown in a magnified image at a right side of FIG. 2, a conformal thin film may be formed on the CNTs.

Figure 3:
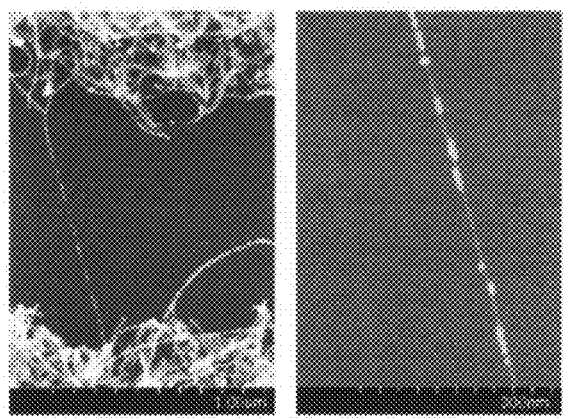
FIG. 3 is a SEM image of alumina deposited on CNTs using a conventional ALD method.

FIG. 3 is a SEM image of alumina deposited on CNTs using a conventional ALD method. As shown in a magnified image at a right side of FIG. 3, alumina does not form a conformal thin film, however, is attached to the CNTs as a nano particle shape. That is, it is seen that a metal oxide cannot be stably formed on CNTs without pre-processing according to the present invention.

A gate oxide film may be uniformly formed on a surface of CNTs using a method of forming a metal oxide film according to the embodiment of the present invention.

If the method of forming a metal oxide film according to the embodiment of the present invention is applied to manufacture a transistor that uses the CNTs as a channel, an ideal carbon nanotube field effect transistor having an all-around structure may be fabricated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a metal oxide film on a carbon nanotube (CNT), comprising:
    forming a chemical functional group surrounding a sidewall of the CNT, the chemical functional group including a hydroxyl group; and
    forming the metal oxide film on the CNT on which the chemical functional group is formed,
    the forming of the chemical functional group surrounding the sidewall including simultaneously supplying a precursor of the metal oxide film and water into a reaction chamber.

2. The method of claim 1, wherein the precursor and the water are supplied for 1 second to 60 seconds.

3. The method of claim 1, wherein the CNT is a single walled CNT or a bundle of the CNT.

4. The method of claim 1, wherein the forming of the chemical functional group and the forming of the metal oxide film are performed substantially at the same temperature.

5. The method of claim 1, wherein the forming of the metal oxide film is performed using an atomic layer deposition (ALD) method.

6. A method of fabricating a carbon nanotube transistor, comprising:
    forming a carbon nanotube (CNT) channel on a substrate;
    forming a chemical functional group surrounding a sidewall of the CNT channel, the chemical functional group including a hydroxyl group;
    forming a metal oxide film on the CNT channel on which the chemical functional group is formed; and
    forming a gate on the metal oxide film,
    the forming of the chemical functional group surrounding the sidewall including simultaneously supplying a precursor of the metal oxide film and water into a reaction chamber.

7. The method of claim 6, wherein the precursor and the water are supplied for 1 second to 60 seconds.

8. The method of claim 6, wherein the CNT channel is a single walled CNT or a bundle of the CNT.

9. The method of claim 6, wherein the forming of the chemical functional group and the forming of the metal oxide film are performed substantially at the same temperature.

10. The method of claim 6, wherein the forming of the metal oxide film is performed using an atomic layer deposition (ALD) method.

11. The method of claim 6, further comprising forming a source and a drain on both ends of the carbon nanotube channel.

12. The method of claim 6, wherein the metal oxide film surrounds the CNT channel.

* * * * *